United States Patent
Pang et al.

(10) Patent No.: US 6,373,779 B1
(45) Date of Patent: Apr. 16, 2002

(54) BLOCK RAM HAVING MULTIPLE CONFIGURABLE WRITE MODES FOR USE IN A FIELD PROGRAMMABLE GATE ARRAY

(75) Inventors: Raymond C. Pang; Steven P. Young, both of San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/574,300

(22) Filed: May 19, 2000

(51) Int. Cl.[7] .............................................. G11C 8/00
(52) U.S. Cl. .................. 365/230.05; 711/142; 711/143; 711/149
(58) Field of Search ...................... 365/230.05, 189.01, 365/154; 711/149, 155, 143, 142

(56) References Cited

U.S. PATENT DOCUMENTS

| | | | |
|---|---|---|---|
| 5,230,045 A | * 7/1993 | Sindhu | 711/203 |
| 5,249,159 A | * 9/1993 | Sato | 365/230.65 |
| 5,550,782 A | 8/1996 | Cliff et al. | |
| 5,659,709 A | * 8/1997 | Quach | 395/473 |
| 5,933,023 A | 8/1999 | Young | |
| 6,049,487 A | * 8/2000 | Plants et al. | 365/189.04 |
| 6,097,664 A | * 8/2000 | Nguyen et al. | 365/230.05 |
| 6,104,663 A | * 8/2000 | Kablanian | 365/230.05 |
| 6,122,218 A | * 9/2000 | Kang | 365/230.05 |
| 6,138,211 A | * 10/2000 | Ahn et al. | 711/136 |

OTHER PUBLICATIONS

"The Programmable Logic Data Book", Sep. 1996; available from Xilinx, Inc., 2100 Logic Drive, San Jose, CA 95124; pp. 4–14 to 4–20.

* cited by examiner

Primary Examiner—Hoai V. Ho
(74) Attorney, Agent, or Firm—E. Eric Hoffman, Esq.; Edel M. Young

(57) ABSTRACT

A dedicated block random access memory (RAM) is provided for a programmable logic device (PLD), such as a field programmable gate array (FPGA). The block RAM includes a memory cell array and control logic that is configurable to select one of a plurality of write modes for accessing the memory cell array. In one embodiment, the write modes include a write with write-back mode, a write without write-back mode, and a read then write mode. The control logic selects the write mode in response to configuration bits stored in corresponding configuration memory cells of the PLD. The configuration bits are programmed during configuration of the PLD. In one variation, the control logic selects the write mode in response to user signals. In a particular embodiment, the block RAM is a dual-port memory having a first port and a second port. In this embodiment, the first and second ports can be independently configured to have different (or the same) write modes. The widths of the first and second ports can also be independently configured.

27 Claims, 9 Drawing Sheets

BLOCK RAM HAVING MULTIPLE CONFIGURABLE WRITE MODES FOR USE IN A FIELD PROGRAMMABLE GATE ARRAY

FIELD OF THE INVENTION

The present invention relates to dedicated block random access memory (RAM) located on a programmable logic device, such as a field programmable gate array (FPGA).

RELATED ART

FPGAs typically include an array of configurable logic blocks (CLBs), input/output blocks (IOBs) and programmable interconnect circuitry that extends between the CLBs and IOBs. Some FPGAs include dedicated columns of block RAM which are located between columns of the CLBs. Such block RAM provides a relatively high-density memory. In the absence of the block RAM, memory could be provided by configuring the CLBs in an appropriate manner. However, a relatively large number of CLBs are required to provide a small memory, thereby resulting in an inefficient use of FPGA resources. An FPGA that includes block RAM is described in U.S. Pat. No. 5,933,023.

The block RAMs present in the above-identified FPGAs are dual-port block RAMs having a single write mode. When a data value is written to a memory cell, that data value appears as an output of the block RAM. This write mode is referred to as a "write with write-back" mode. While the write with write-back mode is useful, the dual-port block RAMs of conventional FPGAs have undesirably been limited to a single write mode. Providing for multiple write modes would advantageously provide the user with more flexibility to suit their application needs.

It would therefore be desirable to have a dual-port block RAM with a plurality of selectable write modes.

SUMMARY

Accordingly, the present invention provides an FPGA that includes block RAM having a plurality of selectable write modes. The block RAM includes a memory cell array and control logic that is configurable to select one of a plurality of write modes for accessing the memory cell array. In one embodiment, the write modes include a write with write-back mode, a write without write-back mode, and a read then write mode. The control logic selects the write mode in response to configuration bits stored in corresponding configuration memory cells of the FPGA. The configuration bits are typically programmed during configuration of the PLD.

In a particular embodiment, the block RAM is a dual-port memory having a first port and a second port. In this embodiment, the first and second ports can be independently configured to have different (or the same) write modes. The widths of the first and second ports can also be independently configured.

The present invention will be more fully understood in view of the following description and drawings.

DETAILED DESCRIPTION

Figure 1:
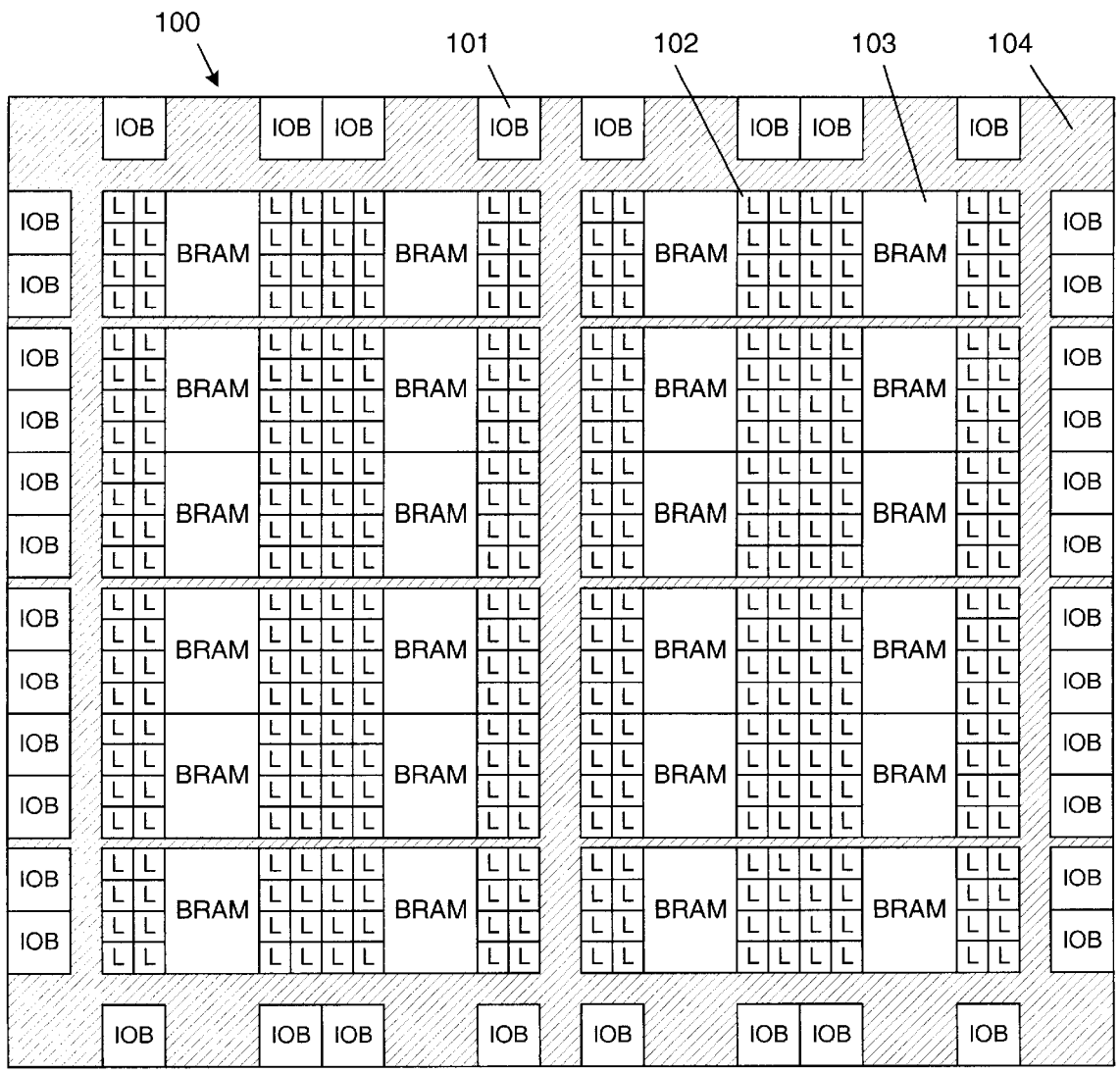
FIG. 1 is a block diagram of the general layout of IOBs, CLBs and block RAMs in accordance with one embodiment of the present invention.

FIG. 1 is a block diagram that illustrates the general layout of IOBs, CLBs and block RAMs and general interconnect circuitry of a field programmable gate array (FPGA) 100 in accordance with one embodiment of the present invention. IOBs, such as IOB 101, are located around the perimeter of the FPGA and are labeled with the letters "IOB". CLBs, such as CLB 102, are labeled with the letter "L". Block RAMS, such as block RAM 103, are labeled with the letters "BRAM". General programmable interconnect circuitry 104 is provided to programmable connect the IOBs, CLBs, block RAMs and configuration circuitry. In the described embodiments, each of the block RAMs has a height equal to the height of four CLBs. In other embodiments, the block RAMs can have other heights. The block RAMs are arranged in columns which extend the height of the CLB array. In addition, each block RAM column is separated from an adjacent block RAM column by a plurality of columns of CLBs. This ensures that a significant and regular amount of logic resources exist between adjacent block RAM columns. Although a particular layout is illustrated, it is understood that many other layouts are possible, and are considered to fall within the scope of the present invention. For example, other embodiments can have other numbers of IOBS, CLBs and block RAMS.

Figure 2:
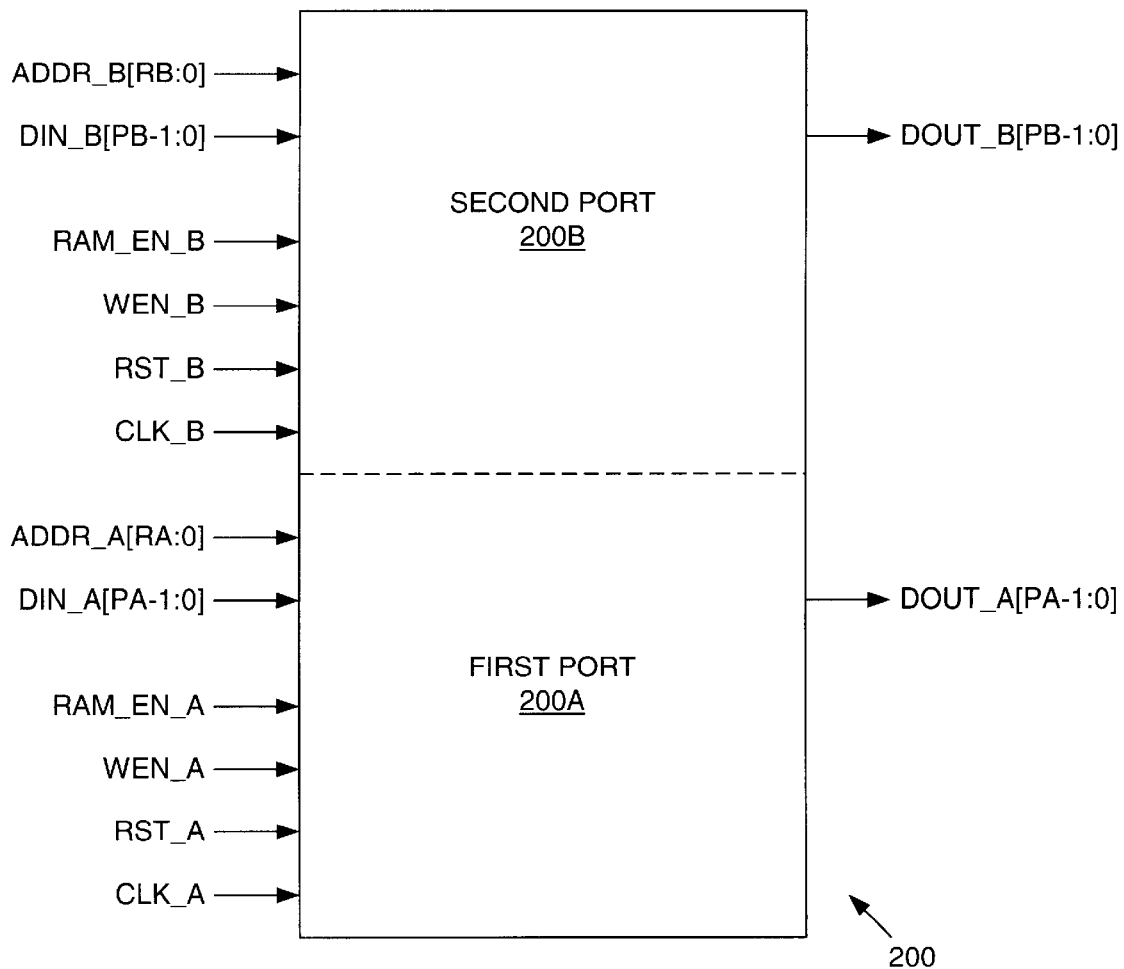
FIG. 2 is a block diagram of a dual-port block RAM in accordance with one embodiment of the present invention.

FIG. 2 is a block diagram illustrating a dual-port block RAM 200 in accordance with one embodiment of the present invention. Dual-port block RAM 200 includes a first port 200A, which is shown at the lower portion of FIG. 2, and a second port 200B, which is shown at the upper half of FIG. 2. In the present embodiment, block RAM 200 includes an array of dual-port SRAM cells that are shared by both block RAM ports 200A and 200B. The logical dimension of this array as seen by each block RAM port is configurable and can be configured independently of the other port. The first port 200A can be configured to access a logical array of PA bit line pairs (columns) and QA word lines (rows). The second port 200B can be configured to access a logical array of PB bit line pairs (columns) and QB word lines (rows). Table 1 lists possible values for PA, QA, PB and QB in accordance with one embodiment of the invention.

TABLE 1

| PA/PB | QA/QB |
|---|---|
| 1 | 16384 |
| 2 | 8192 |
| 4 | 4096 |
| 8 | 2048 |

TABLE 1-continued

| PA/PB | QA/QB |
|---|---|
| 16 | 1024 |
| 32 | 512 |

The first port 200A includes terminals for receiving an input address signal ADDR_A[RA:0], an input data signal DIN_A[PA-1:0], a first port enable signal RAM_EN_A, a first port write enable signal WEN_A, a first port reset signal RST_A and a first port clock signal CLK_A. The symbol "RA" represents an integer equal to $\log_2 QA$ minus 1. For example, if QA is equal to 128 (i.e., there are 128 word lines), then RA is equal to 7 (i.e., 8-1). The first port 200A also includes terminals for providing an output data signal DOUT_A[PA-1:0].

The second port 200B includes terminals for receiving an input address signal ADDR_B[RB:0], an input data signal DIN_B[PB-1:0], a second port enable signal RAM_EN_B, a second port write enable signal WEN_B, a second port reset signal RST_B and a second port clock signal CLK_B. The second port 200B also includes terminals for providing an output data signal DOUT_B[PB-1:0].

In the described example, the operation of the first port 200A is described. It is understood that the operation of the second port 200B is identical to, but independent of, the operation of the first port 200A. Also in the described example, the input and output data values of the first port 200A are selected to have widths equal to the width of block RAM 200. That is, the width PA of the input and output data values is equal to the number of bit line pairs in the memory cell array in block RAM 200. This simplifies the description of the present invention. However, in other embodiments, the input and output data values can have widths less than the width of block RAM 200. In such embodiments, conventional multiplexing and column select circuitry is used to route the data values to and from block RAM 200.

As described in more detail below, each of the dual-port cells in the can be accessed through either the first port 200A or the second port 200B. As also described in more detail below, the write mode of each of the ports can be independently selected. Thus, the first port 200A can be configured to have a first write mode, while the second port 200B can be configured to have a second write mode, different from the first write mode.

Figure 3:
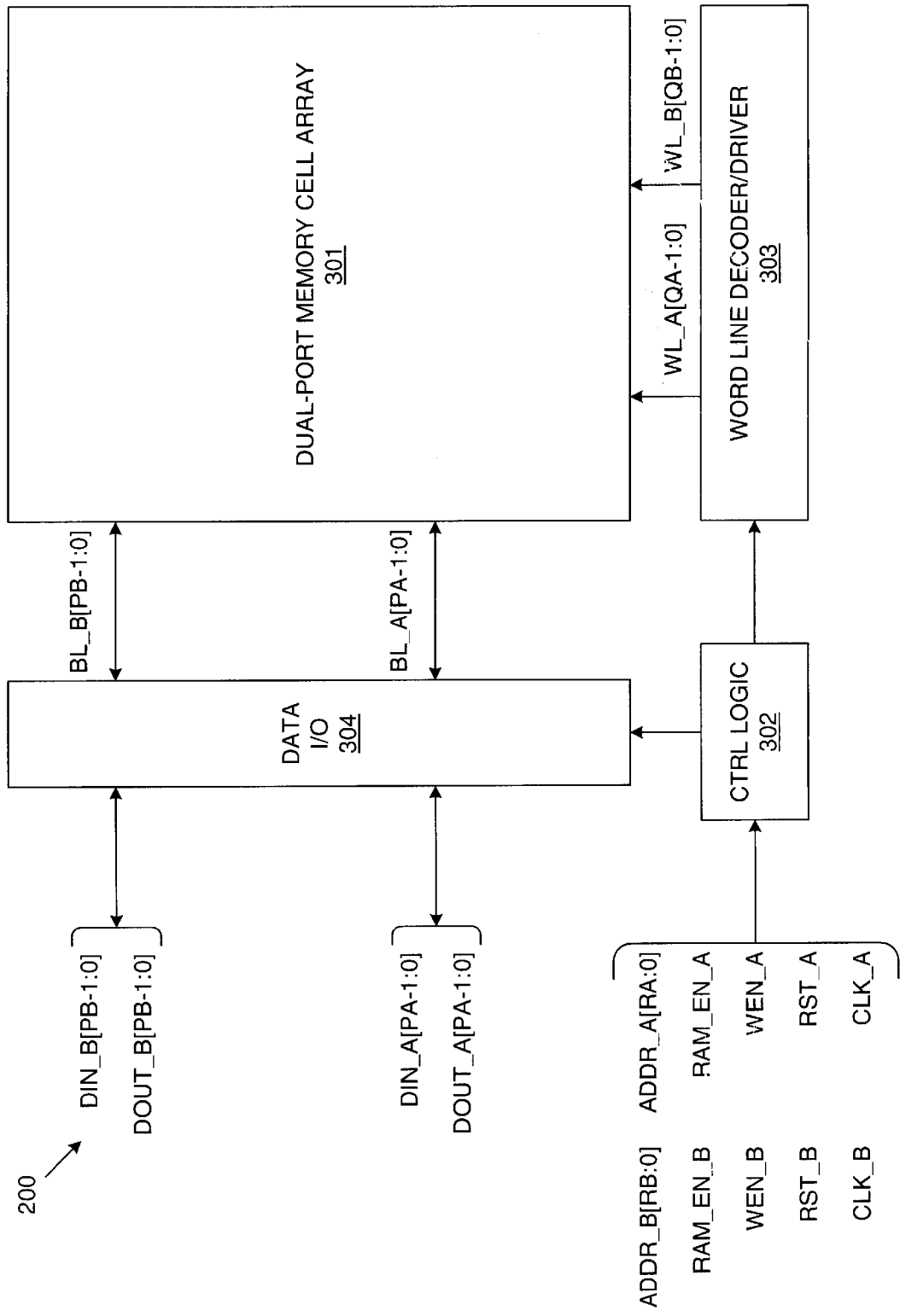
FIG. 3 is a block diagram showing the block RAM of FIG. 2 in more detail.

FIG. 3 is a block diagram illustrating block RAM 200 in greater detail. Block RAM 200 includes a dual-port memory cell array 301, control logic 302, word line decoder/driver circuit 303, and data input/output (I/O) circuit 304. Control logic 302 is coupled to receive the input signals ADDR_A [RA:O], RAMEN_A, WEN_A, RST_A and CLK_A for the first port, as well as the input signals ADDR_B[RB:O], RAM_EN_B, WEN_B, RST_B and CLK_B for the second port.

First port word lines WL_A[QA-1:0] and second port word lines WL_B[QB-1:0] run vertically through memory cell array 301. The word lines WL_A[QA-1:0] and WL_B [QB-1:0] are controlled by word line decoder/driver 303.

First port bit line pairs BL_A[PA-1:0] and second port bit line pairs BL_B[PB-1:0] run horizontally through memory cell array 301. Bit line pairs BL_A[PA-1:0] and BL B[PB-1:0] are coupled to data I/O circuit 304 as illustrated.

Data I/O circuit 304 routes the input data values DIN_A[PA-1:0] and DIN_B[PB-1:0] to memory cell array 301, and routes the output data values DOUT_A[PA-1:0] and DOUT_B[PB-1:0] from memory cell array 301 under the control of control logic 302 in the manner described below.

Figure 4:
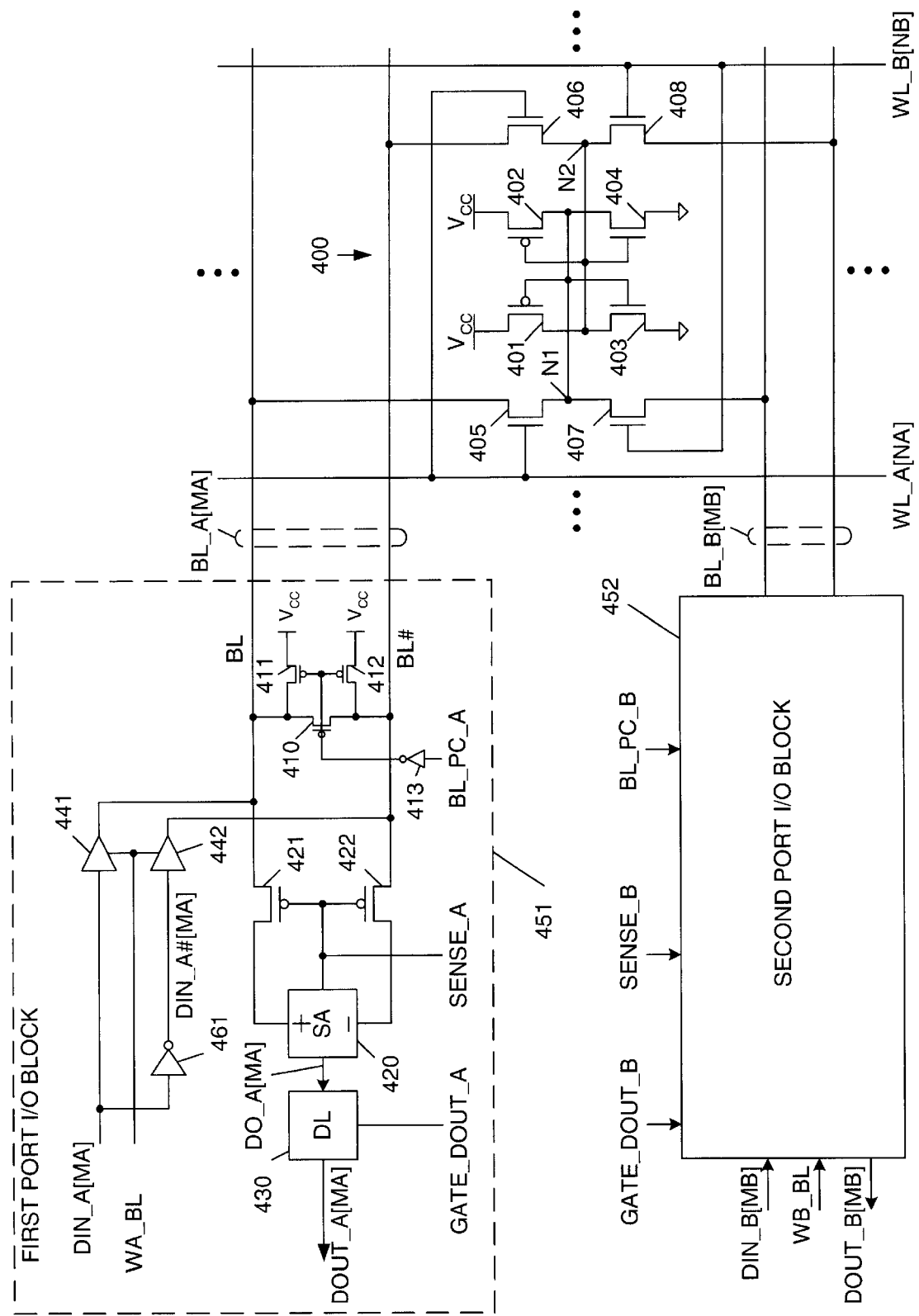
FIG. 4 is a circuit diagram of a dual-port SRAM memory cell and associated I/O circuitry in accordance with one embodiment of the present invention.

FIG. 4 is a circuit diagram of a dual-port SRAM memory cell 400 in memory cell array 301 and associated I/O blocks 451–452 in data I/O circuit 304. Each of the bit line pairs in memory cell array 301 is coupled to an associated I/O block in data I/O circuit 304. I/O block 451 is coupled to the bit lines of the first port of memory cell 400, and I/O block 452 is coupled to the bit lines of the second port of memory cell 400. Because I/O blocks 451 and 452 include identical circuitry, only I/O block 451 is described in detail. As illustrated by FIG. 4, I/O blocks 451 and 452 operate in response to similar signals.

Dual-port SRAM cell 400 includes p-channel pull-up transistors 401–402, n-channel pull-down transistors 403–404 and n-channel access transistors 405–408. Transistors 401–404 are configured to form a cross-coupled latch, which stores a logic high or logic low data value.

At the first port of SRAM cell 400, the drains of access transistors 405 and 406 are coupled to storage nodes N1 and N2, respectively. The gates of access transistors 405–406 are coupled to word line WL_A[NA], where NA is an integer between 0 and QA, inclusive. The sources of access transistors 405–406 are coupled to complementary bit line pair BL A[MA], where MA is an integer between 0 and PA, inclusive.

At the second port of SRAM cell 400, the drains of access transistors 407 and 408 are coupled to storage nodes N1 and N2, respectively. The gates of access transistors 407–408 are coupled to word line WL_B[NB], where NB is an integer between 0 and QB, inclusive. The sources of access transistors 407–408 are coupled to complementary bit line pair BL_B[MB], where MB is an integer between 0 and PB, inclusive.

First port I/O block 451 includes p-channel bit line equalization transistor 410, p-channel pre-charge transistors 411–412, inverter 413, p-channel bit line select transistors 421–422, sense amplifier 420, data latch 430, tri-state write buffers 441–442 and inverter 461.

Bit line equalization transistor 410 is connected across bit lines BL and BL# of the complementary bit line pair BL_A[MA]. Pre-charge transistors 411 and 412 are connected between bit lines BL and BL#, respectively, and the Vcc voltage supply terminal. The gates of transistors 410–412 are coupled to receive the inverse of a bit line pre-charge signal (BL_PC_A) from inverter 413. The bit line pre-charge signal BL_PC_A is provided by control logic 302 (FIG. 3).

Bit line select transistors 421 and 422 are connected in series with bit lines BL and BL#, respectively, of the complementary bit line pair BL_A[MA]. The gates of bit line select transistors 421 and 422 are coupled to receive a sense amplifier enable signal (SENSE_A) provided by control logic 302 (FIG. 3).

Sense amplifier 420 is also coupled to receive the sense amplifier enable signal SENSE_A from control logic 302. When the SENSE_A signal is asserted high, sense amplifier 420 is enabled. Differential input terminals of sense amplifier 420 are coupled to bit lines BL and BL# of bit line pair BL_A[MA] through select transistors 421–422. As described in more detail below, sense amplifier 420 provides an output signal (DO_A[MA]) on its output terminal.

The output terminal of sense amplifier 420 is coupled to an input terminal of data latch 430. Data latch 430 latches the DO_A[MA] signal provided by sense amplifier 420 in response to a GATE_DOUT_A control signal, which is provided by control logic 302. The signal stored by data latch 430 is provided as the data output signal DOUT_A [MA].

Tri-state write data buffers 441–442 are coupled to receive the data input signal DIN_A[MA] and the complement of the data input signal DIN_A#[MA], respectively, where MA is an integer between 0 and PA, inclusive. Inverter 461 provides the complementary data input signal DIN_A# [MA] in response to the data input signal DIN_A[MA]. Tri-state write data buffers 441–442 are enabled and disabled in response to a write control signal WA_BL that is provided by control circuit 302.

In accordance with one embodiment of the present invention, each port of block RAM 200 can be controlled to operate in one of three separate and programmable write modes, independently of the other port. One of the three write modes is selected by programming control logic 302 in the appropriate manner. In the described embodiment, this programming is performed during the configuration of FPGA 100. In another embodiment, this programming can be performed with user signals after the configuration of FPGA 100. These three write modes are: 1) a write with write-back mode; 2) a write without write-back mode; and 3) a read then write mode. Providing for all three write modes advantageously provides the user with more flexibility to suit their application needs. The three write modes (and a read mode) are described in connection with dual-port SRAM cell 400 and I/O block 451.

Figure 5:
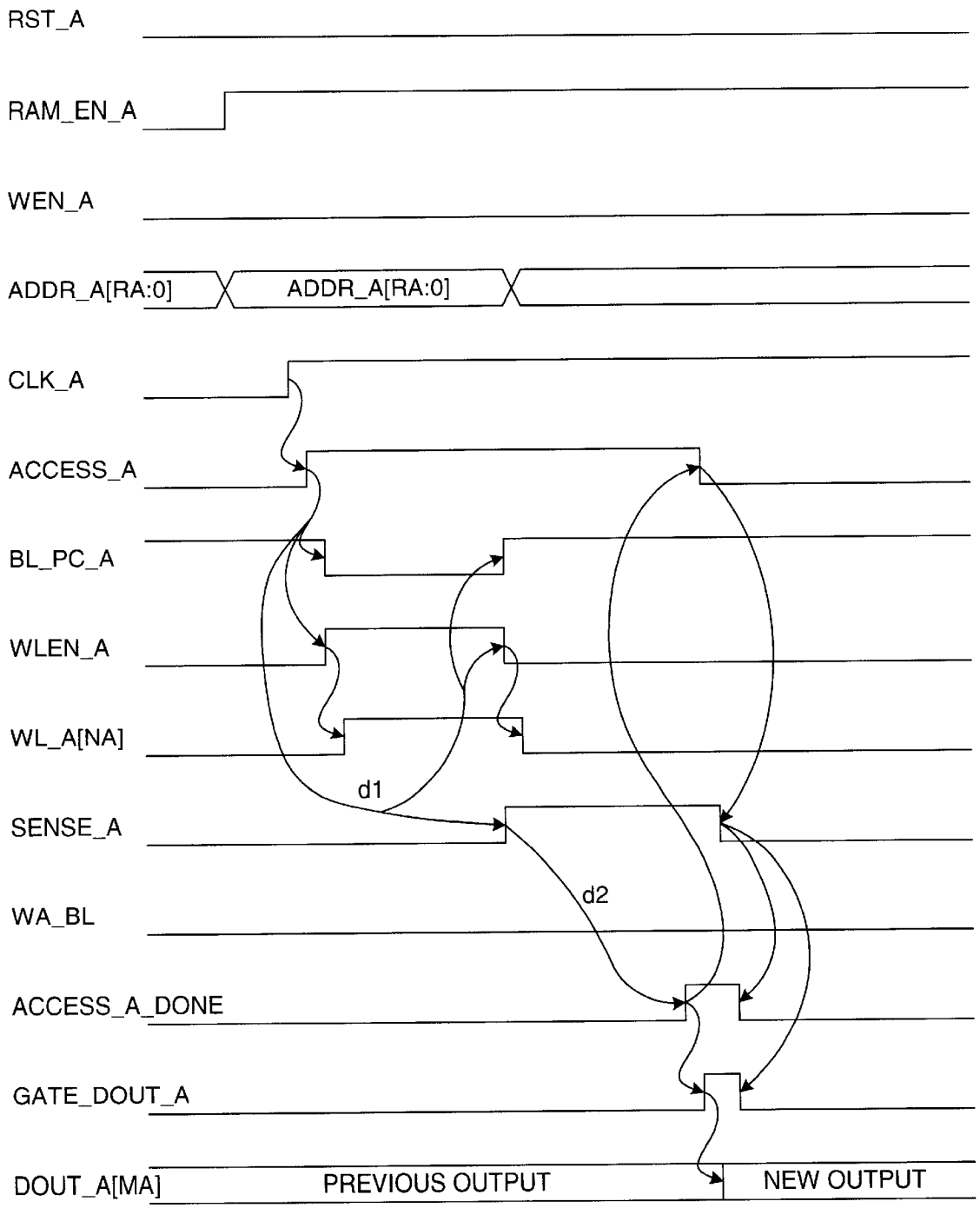
FIG. 5 is a waveform diagram illustrating a read access of the memory cell of FIG. 4.

FIG. 5 is a waveform diagram illustrating a read access of memory cell 400. To perform a read access, the RST_A signal must be de-asserted low. The BL_PC_A signal is asserted high, thereby turning on transistors 410–412. Under these conditions, bit lines BL and BL# are pre-charged to the Vcc supply voltage. The SENSE_A signal is de-asserted low, thereby turning on bit line select transistors 421–422 and disabling sense amplifier 420.

The RAM_EN_A signal is asserted, thereby instructing control logic 302 to enable the first port of block RAM 200. The WEN_A signal has a low value, thereby indicating that the current access is a read access. An address ADDR_A [RA:0] identifying the SRAM cells to be accessed (including SRAM cell 400) is also applied to control logic 302. Control logic 302 provides the value of address ADDR_A[RA:0] to word line decoder/driver 303.

In response to the next rising edge of the CLK_A signal, control logic 302 asserts an access control signal (ACCESS_A) to a logic high value. In response to the rising edge of the ACCESS_A signal, control logic 302 de-asserts the bit line pre-charge signal (BL_PC_A) to a logic low value. Also in response to the asserted ACCESS_A signal, control logic 302 asserts a word line enable signal WLEN_ A. When asserted, the WLEN A signal enables word line decoder/driver 303 to assert one of the word line signals WL_A[QA-1:0] in response to the address signal ADDR_ A[RA:0]. Thus, in response to the asserted WLEN_A signal, word line decoder/driver 303 asserts the word line signal WL_A[NA] to a logic high value, where NA is identified by the address ADDR_A[RA:0].

Bit line equalization transistor 410 and pre-charge transistors 411–412 are turned off in response to the low BL_PC_A signal, thereby releasing the pre-charged bit lines BL and BL#. The logic high WL_A[NA] signal causes access transistors 405 and 406 to turn on, thereby coupling storage nodes N1 and N2 of memory cell 400 to bit lines BL and BL#. At this time, a small differential voltage representative of the data value stored in memory cell 400 will start being developed across bit lines BL and BL#, as well as across the differential input terminals of sense amplifier 420 (via turned on bit line select transistors 421 and 422).

After a first predetermined delay (d1), which is selected to allow the differential voltage across bit line BL and BL# to become large enough to be reliably detected by sense amplifier 420, control logic 302 asserts the SENSE_A signal to a logic high value, thereby enabling sense amplifier 420. As a result, sense amplifier 420 resolves the differential voltage developed across its differential input terminals into an output signal DO_A[MA] having a logic "0" or a logic "1" value. At the same time, the high SENSE_A signal turns off column select transistors 421–422, thereby de-coupling sense amplifier 420 from bit lines BL and BL# to allow for quicker resolution.

Control logic 302 also de-asserts the WLEN_A signal after the first predetermined delay d1. In response, word line decoder/driver 303 de-asserts the word line signal WL_A [NA], thereby turning off access transistors 405–406. In addition, control logic 302 asserts the BL_PC_A signal high after the first predetermined delay d1, thereby turning on equalization transistor 410 and pre-charge transistors 411–412. As a result, the voltages on bit lines BL and BL# are pre-charged and equalized in preparation for subsequent accesses.

After a second predetermined delay d2, which is selected to enable the DO_A[MA] signal provided by sense amplifier 420 to propagate to data latch 430, control logic 302 asserts another access control signal (ACCESS_A_DONE) at a logic high value. In response to the asserted ACCESS_ A_DONE signal, control logic 302 asserts the GATE_ DOUT_A signal at a logic high value. In response to the asserted GATE_DOUT_A signal, data latch 430 latches the DO_A[MA] signal provided by sense amplifier 420. As a result, data latch 430 provides the data value read from memory cell 400 as the output data value DOUT_A[MA].

Control logic 302 also de-asserts the ACCESS_A signal to a logic low value in response to the high ACCESS_A_ DONE signal. In response to the de-asserted ACCESS_A signal, control logic 302 de-asserts the SENSE A signal (low), thereby disabling sense amplifier 420 and turning on bit line select transistors 421–422. Turned on transistors 421–422 couple pre-charged bit lines BL and BL# to sense amplifier 420 in preparation for the next access. In response to the de-asserted SENSE_A signal, control logic 302 de-asserts the GATE_DOUT_A and ACCESS_A_DONE signals to logic low values, thereby completing the read operation. The WA_BL signal is low during the entire read operation.

Figure 6:
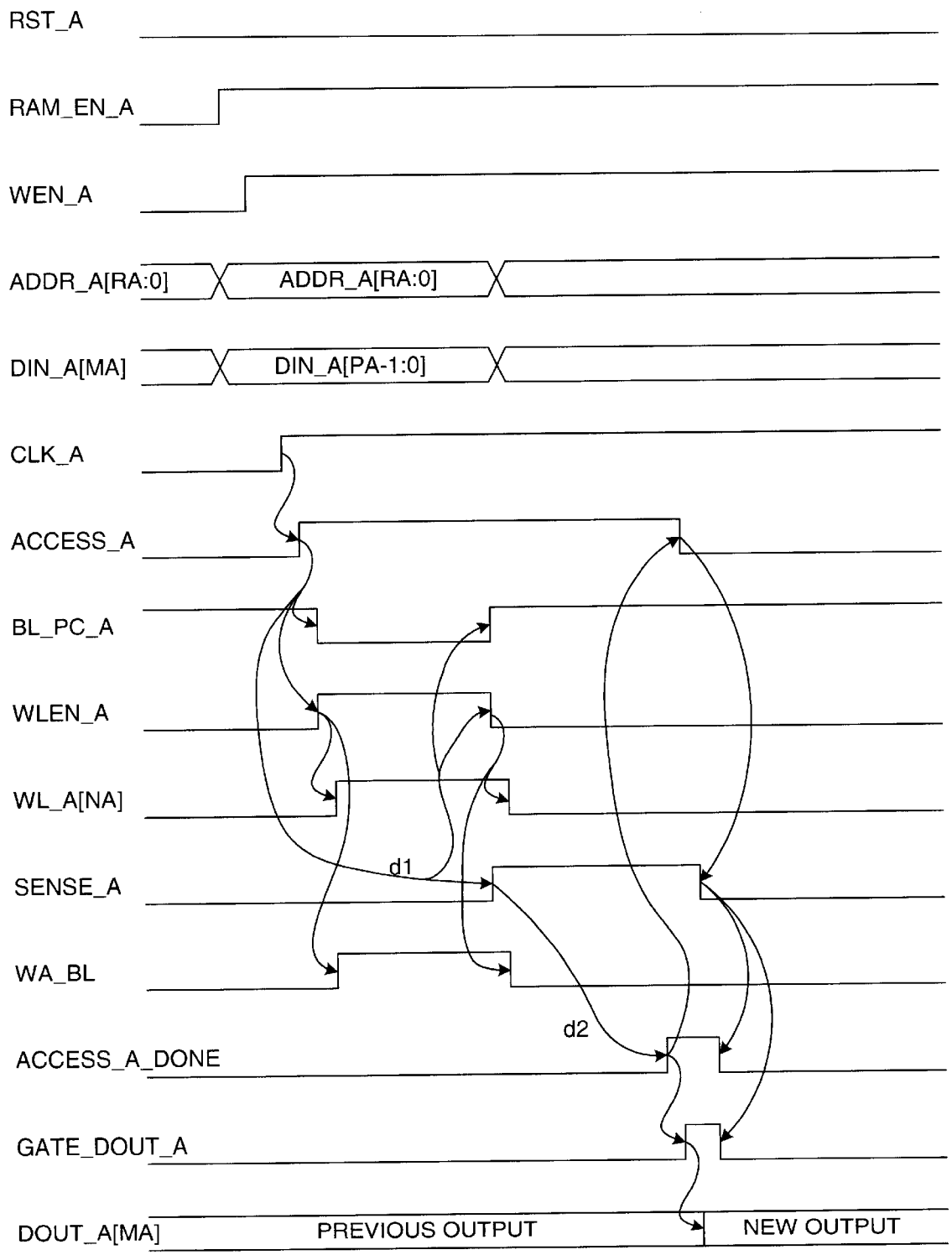
FIG. 6 is a waveform diagram illustrating a write with write-back access of the memory cell of FIG. 4.

FIG. 6 is a waveform diagram illustrating the first write mode, a write with write-back mode, which causes the value from the input data bus (DIN_A) to appear at the output data bus (DOUT_A). Note that a write with write-back operation is similar to the above-described read operation (FIG. 5), with the write control signal WA_BL being asserted during the write with write-back operation. A write with write-back operation mimics the behavior of many SRAM integrated circuit chips. A write with write-back operation to memory cell 400 is performed as follows.

The RST_A signal is de-asserted during the write with write-back access. The BL_PC_A signal is asserted high, thereby turning on transistors 410–412. Under these conditions, bit lines BL and BL# are pre-charged to the Vcc supply voltage. The SENSE_A signal is de-asserted low, thereby turning on bit line select transistors 421–422 and disabling sense amplifier 420.

The RAM_EN_A signal is asserted, thereby instructing control logic 302 to enable the first port of block RAM 200. The write enable signal WEN_A is also asserted, thereby indicating to control logic 302 that the current access to the first port is a write access. An address ADDR_A[RA:0] identifying the SRAM cells to be written (including SRAM cell 400) is also applied to control logic 302. Control logic 302 provides the value of address ADDR_A[RA:0] to word line decoder/driver 303. The data value DIN_A[MA] to be written to memory cell 400 is provided to data I/O block 451. The data value DIN_A[MA] and its complement DIN_A#[MA] are routed to tri-state buffers 441–442, respectively.

In response to the next rising edge of the CLK_A signal, control logic 302 asserts the ACCESS_A signal to a logic high value. In response to the rising edge of the ACCESS_A signal, control logic 302 de-asserts the bit line pre-charge signal (BL_PC_A) to a logic low value. Also in response to the asserted ACCESS_A signal, control logic 302 asserts the word line enable signal WLEN_A, thereby enabling word line decoder/driver 303 to assert one of the word line signals WL_A[QA-1:0] in response to the address signal ADDR_A[RA:0]. Thus, in response to the asserted WLEN_A signal, word line decoder/driver 303 asserts the word line signal WL_A[NA] to a logic high value, where NA is identified by the address ADDR_A[RA:0]. These steps are similar to those described above in connection with the read operation.

Bit line equalization transistor 410 and pre-charge transistors 411–412 are turned off in response to the low BL_PC_A signal, thereby releasing the pre-charged bit lines BL and BL#. The logic high WL_A[NA] signal causes access transistors 405 and 406 to turn on, thereby coupling storage nodes N1 and N2 of memory cell 400 to bit lines BL and BL#.

In response to the rising edge of the WLEN_A signal, control logic 302 asserts the WA_BL signal to a logic high value, thereby enabling tri-state buffers 441–442. In response, tri-state buffers 441–442 drive the write data value DIN_A[MA] and its complement DIN_A[MA] onto bit lines BL and BL#. The write data signals on the bit lines BL and BL# are transmitted through the turned on access transistors 405–406, and applied to the cross-coupled latch formed by transistors 401–404. As a result, the data value DIN_A[MA] is written to memory cell 400.

After the first predetermined delay d1, the sense amplifier enable signal (SENSE_A) is asserted high, enabling sense amplifier 420. As a result, the data value DIN_A[MA] developed across the input terminals of sense amplifier 420 is resolved by sense amplifier 420, thereby providing a signal DO_A[MA] having a logic "0" or a logic "1" value. At the same time, the high SENSE_A signal turns off column select transistors 421–422, thereby de-coupling sense amplifier 420 from bit lines BL and BL#.

The WLEN_A signal is de-asserted low after the first predetermined delay d1. The WLA_[NA] signal is de-asserted in response to the low WLEN_A signal, thereby turning off access transistors 405–406. The WA_BL signal is also de-asserted low in response to the low WLEN_A signal, thereby disabling tri-state buffers 441–442.

In addition, the BL_PC_A signal is asserted high after the first predetermined delay d1, thereby turning on the equalization transistor 410 and pre-charge transistors 411–412, thereby pre-charging and equalizing the voltages on bit lines BL and BL#.

After the second predetermined delay d2, control logic 302 asserts the ACCESS_A_DONE signal at a logic high value. In response to the asserted ACCESS_A_DONE signal, control logic 302 asserts the GATE_DOUT_A signal at a logic high value. In response, data latch 430 latches the DO_A[MA] signal provided by sense amplifier 420. Note that the DO_A[MA] signal is the same as the DIN_A[MA] signal written to SRAM cell 400. As a result, the data latch 430 provides the data value written to memory cell 400 as the output data value DOUT_A[MA]. This is referred to as a write with write-back operation.

Control logic 302 also de-asserts the ACCESS_A signal to a logic low value in response to the high ACCESS_A_DONE signal. In response to the de-asserted ACCESS_A signal, control logic 302 de-asserts the SENSE_A signal (low), thereby disabling sense amplifier 420 and turning on bit line select transistors 421–422. Turned on transistors 421–422 couple the pre-charged bit lines BL and BL# to sense amplifier 420 in preparation for the next access. In response to the de-asserted SENSE_A signal, control logic 302 de-asserts the GATE_DOUT_A and ACCESS_A_DONE signals at logic low values, thereby completing the write with write-back operation.

Figure 7:
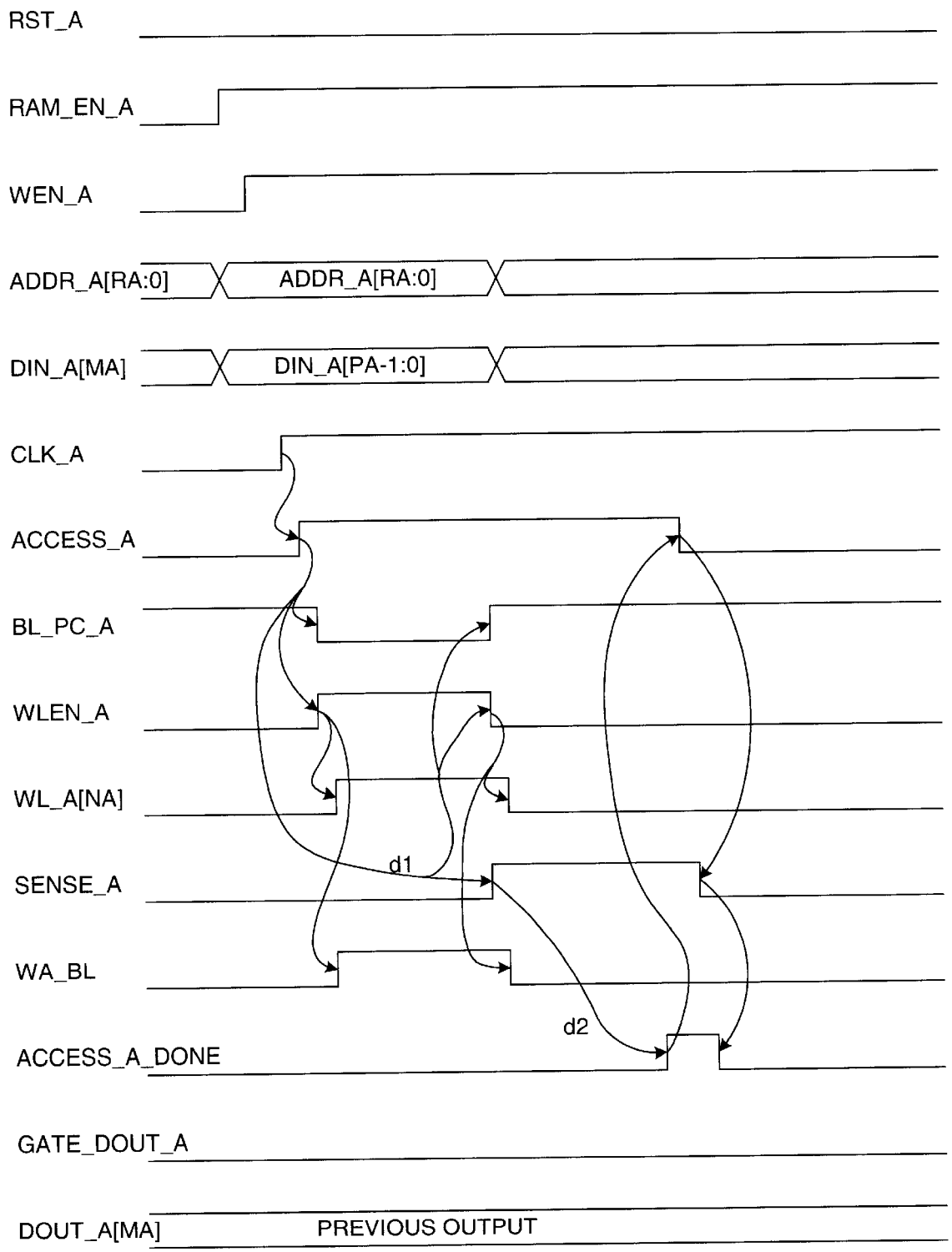
FIG. 7 is a waveform diagram illustrating a write without write-back access of the memory cell of FIG. 4.

FIG. 7 is a waveform diagram illustrating the second write mode, a write without write-back mode, which leaves the output data bus (DOUT_A) unchanged when the value from the input data bus (DIN_A) is written. Note that a write without write-back operation is performed in a manner similar to a write with write-back operation (FIG. 6). The only difference between the two operations is that control logic 302 does not assert the GATE_DOUT_A signal during the write without write-back operation. As a result, the data value DIN_A[MA] written to memory cell 400 is not transferred into data latch 430. Consequently, the previous value stored in data latch 430 continues to be provided as the output signal DOUT_A[MA].

Figure 8:
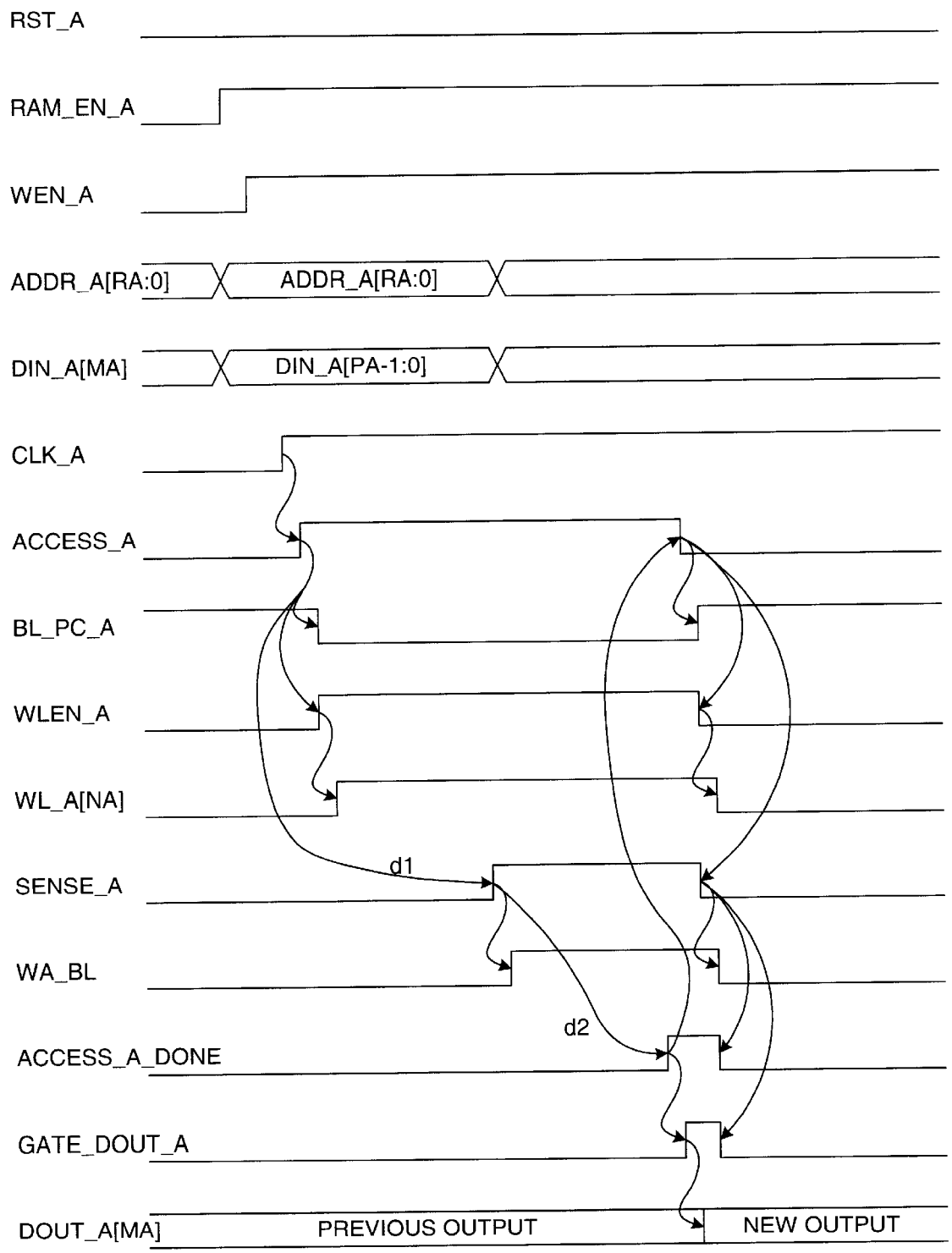
FIG. 8 is a waveform diagram illustrating a read then write access of the memory cell of FIG. 4.

FIG. 8 is a waveform diagram illustrating the third write mode, a read then write mode, which causes the value stored in the memory cell to be copied to the output data bus (DOUT_A) before the value from the input data bus (DIN_A) is written to the memory cell. A read then write operation to memory cell 400 is performed as follows.

A read then write operation begins in the same manner as a read operation. Thus, the RST_A signal has a logic low value. The BL_PC_A signal is asserted high, thereby turning on transistors 410–412 and pre-charging bit lines BL and BL# to the Vcc supply voltage. The SENSE_A signal is de-asserted low, thereby turning on bit line select transistors 421–422 and disabling sense amplifier 420. The RAM_EN_A signal is then asserted, thereby enabling the first port of block RAM 200. The write enable signal WEN_A is also asserted, thereby indicating that the current access is a write access. The address ADDR_A[RA:0] identifying the SRAM cells to be accessed (including SRAM cell 400) is also applied to control logic 302, which in turn, provides the value of address ADDR_A[RA:0] to word line decoder/driver 303. The write data value DIN_A[MA] and its complement DIN_A#[MA] are provided to tri-state buffers 441–442, respectively, in data I/O block 451. However, tri-state buffers 441–442 are not enabled at this time.

In response to the next rising edge of the CLK_A signal, control logic 302 asserts the ACCESS_A signal to a logic high value. In response to the rising edge of the ACCESS_A signal, control logic 302 de-asserts the bit line pre-charge signal (BL_PC_A) to a logic low value. Also in response to the asserted ACCESS_A signal, control logic 302 asserts a word line enable signal WLEN_A. In response to the asserted WLEN_A signal, word line decoder/driver 303 asserts the word line signal WL_A[NA] to a logic high value, where NA is identified by the address ADDR_A [RA:0].

Bit line equalization transistor 410 and pre-charge transistors 411–412 are turned off in response to the low BL_PC_A signal, thereby releasing the pre-charged bit lines BL and BL#. The logic high WL_A[NA] signal causes access transistors 405 and 406 to turn on, thereby coupling storage nodes N1 and N2 of memory cell 400 to bit lines BL and BL#. At this time, a small differential voltage representative of the data value stored in memory cell 400 will start being developed across bit lines BL and BL#, as well as across the differential input terminals of sense amplifier 420 (via turned on bit line select transistors 421 and 422).

After the first predetermined delay d1, control logic 302 asserts the SENSE_A signal to a logic high value, thereby enabling sense amplifier 420. As a result, sense amplifier 420 resolves the differential voltage developed across its differential input terminals into an output signal DO_A [MA] having a logic "0" or a logic "1" value. Thus, the value resolved by sense amplifier 420 corresponds with the data signal read from memory cell 400. At the same time, the high SENSE_A signal turns off column select transistors 421–422, thereby de-coupling sense amplifier 420 from bit lines BL and BL#. Sense amplifier 420 must be isolated from bit lines BL and BL# before tri-state buffers 441–442 are subsequently turned on to drive the write data signal onto the bit lines BL and BL#. If sense amplifier 420 remained coupled to bit lines BL and BL# when tri-state buffers 421–422 are turned on, the write data signal would overpower the data signal being read from memory cell 400.

In response to the rising edge of the SENSE_A signal, control logic 302 asserts the WA_BL signal to a logic high value, thereby enabling tri-state buffers 441–442. In response, tri-state buffers 441–442 drive the data signal DIN_A[MA] and its complement DIN_A#[MA] onto bit lines BL and BL#. The write data signals on the bit lines BL and BL# are transmitted through the turned on access transistors 405–406, and applied to the cross-coupled latch formed by transistors 401–404. As a result, the data signal DIN_A[MA] is written to memory cell 400.

After the second predetermined delay d2, control logic 302 asserts the ACCESS_A_DONE signal at a logic high value. In response to the asserted ACCESS_A_DONE signal, control logic 302 asserts the GATE_DOUT_A signal at a logic high value. In response, data latch 430 latches the DO_A[MA] signal provided by sense amplifier 420. Note that the DO_A[MA] signal is the same as the signal read from SRAM cell 400 at the beginning of the access. As a result, data latch 430 provides the data value initially read from memory cell 400 as the output data value DOUT_A[MA]. This is referred to as a read then write operation.

Control logic 302 also de-asserts the ACCESS_A signal to a logic low value in response to the high ACCESS_A_DONE signal. In response to the de-asserted ACCESS_A signal, control logic 302 de-asserts the WLEN_A signal, which in turn causes the WL_A[NA] signal to be de-asserted, thereby turning off access transistors 405–406. Control logic 302 also asserts the BL_PC_A signal in response to the de-asserted ACCESS_A signal, thereby turning on transistors 410–412 to pre-charge and equalize the voltages on bit lines BL and BL# in preparation for the next access. Control logic 302 also de-asserts the SENSE_A signal in response to the de-asserted ACCESS_A signal, thereby disabling sense amplifier 420, and turning on transistors 421–422 to couple bit lines BL and BL# to sense amplifier 420. In addition, control logic 302 de-asserts the WA_BL signal in response to the de-asserted SENSE_A signal, thereby disabling tri-state buffers 441–442.

Also in response to the de-asserted SENSE_A signal, control logic 302 de-asserts the GATE_DOUT_A and ACCESS_A_DONE signals at logic low values, thereby completing the read then write operation. The read then write operation advantageously combines two operations in one cycle, thereby saving memory cycles. In one example, the read then write mode can be used to implement circular buffers in a digital signal processing (DSP) filter.

In the described embodiment, the write mode of the first port 200A is selected by control logic 302 in response to a first pair of configuration bits stored in a corresponding first pair of configuration memory cells. Similarly, the write mode of the second port 200B is selected by control logic 302 in response to second pair of configuration bits stored in a corresponding second pair of configuration memory cells.

Figure 9:
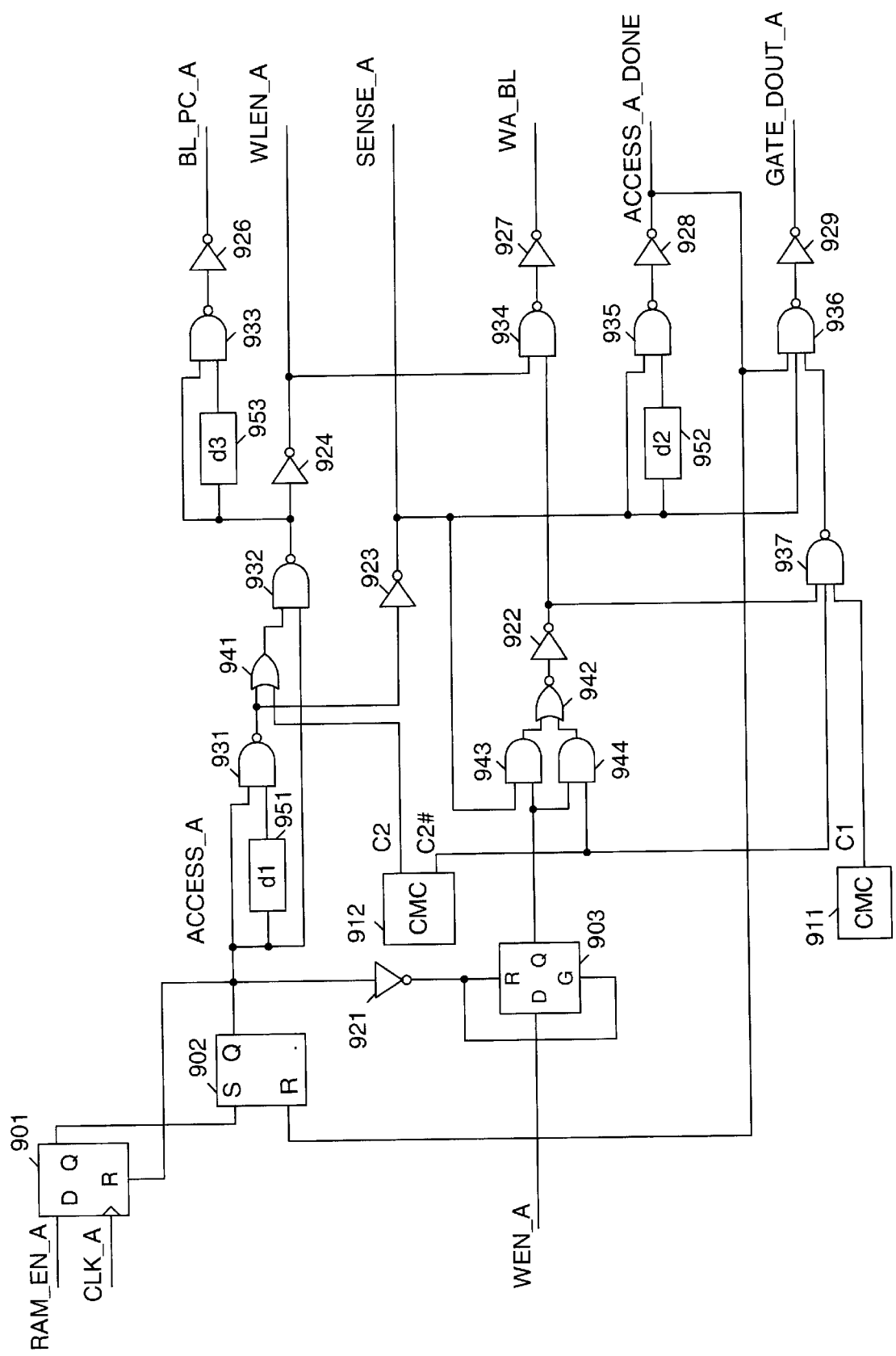
FIG. 9 is a circuit diagram of control logic associated with one port of the dual-port block RAM of FIG. 2 in accordance with one embodiment of the present invention.

FIG. 9 is a circuit diagram of the portion of control logic 302 used to control the first port 200A in accordance with one embodiment of the present invention. The portion of control logic 302 used to control the second port 200B is identical to the portion of control logic 302 used to control the first port 200A.

The illustrated portion of control logic 302 includes DQ flip flop 901, set-reset (SR) flip-flop 902, D latch 903, configuration memory cells 911–912, inverters 921–929, NAND gates 931–937, OR gate 941, NOR gate 942, AND gates 943–944 and delay circuits 951–953, which are connected as illustrated. Configuration memory cells 911 and 912 are programmed to store configuration bits C1 and C2, respectively. The values of configuration bits C1 and C2 determine which write mode is selected for the first port 200A. Table 2 summarizes the states of configuration bits C1 and C2 for the read mode and the three write modes. The symbol "X" represents a "don't care" value.

TABLE 2

| CYCLE | C1 | C2 |
|---|---|---|
| Read | X | X |
| Write w/ write-back | 0 | 0 |
| Write w/o write-back | 1 | 0 |
| Read then write | X | 1 |

DQ flip-flop 901 is coupled to receive the RAM_EN_A and CLK_A signals. To enable the first port of block RAM 200 for an operation, the RAM_EN_A signal is asserted high. The rising edge of the CLK_A signal causes the high RAM_EN_A signal to be latched into DQ flip-flop 901. The logic high value at the Q output terminal of DQ flip-flop 901 is provided to the S input terminal of SR flip-flop 902. This logic high value sets SR flip-flop 902, thereby causing SR flip-flop to provide a logic high Q output signal. The Q output signal provided by SR flip-flop 902 corresponds with the ACCESS_A signal.

The high ACCESS_A signal is provided to the reset input terminal of DQ flip-flop 901, thereby resetting this flip-flop 901 to provide a logic low Q output signal. Resetting DQ flip-flop 901 prepares this flip-flop 901 for subsequent accesses.

After a pre-determined delay, which is equal to the delay d1 of delay circuit 951 plus the delay d2 of delay circuit 952, the ACCESS_A_DONE signal is asserted high. The ACCESS_A_DONE signal is generated by delay elements 951–952, NAND gates 931 and 935, and inverters 923 and 928 in response to the ACCESS_A signal. The ACCESS_A_DONE signal is applied to the reset (R) input terminal of SR flip-flop 902. Thus, when the ACCESS_A_DONE signal is asserted high, SR flip-flop is reset, thereby causing the ACCESS_A signal to transition to a logic low value.

The logic high ACCESS_A signal causes the output signal provided by NAND gate 932 to have a logic low value. As a result, the BL_PC_A signal is de-asserted low (via NAND gate 933 and inverter 926) almost immediately after the ACCESS_A signal is asserted high. When the BL_PC_A signal is asserted high depends on the configuration bit C2 stored in configuration memory cell 912. If configuration bit C2 has a logic low value, then the BL_PC_A signal transitions back to a high value after a predetermined delay equal to the delay d1 of delay circuit 951 plus the delay d3 of delay circuit 953. The logic low configuration bit C2 causes OR gate 941 to pass the output signal provided by NAND gate 931 to the input terminal of NAND gate 932. As a result, the output signal of NAND gate 932 will transition to a logic high value one delay d1 (as defined by delay circuit 951) after the ACCESS_A signal is asserted. After the output signal provided by NAND gate 932 transitions to a logic high value, the BL_PC_A signal will transition to a logic high value one delay d3 later (as defined by delay circuit 953). The delay d3 is selected to be just long enough to ensure that the BL_PC_A signal goes high after the WLEN_A signal goes low, such that the cross coupled latch of an accessed memory cell is not coupled to the pre-charge circuitry, and the tri-state bit line drivers don't contend with the pre-charge circuitry during a write access operation. The configuration bit C2 is set to a logic low value for the write with write back mode and the write without write back mode. (FIGS. 6 and 7.)

If the configuration bit C2 has a logic high value, then the BL_PC_A signal will transition back to a high value after a predetermined delay equal to the sum of delays d1, d2 and d3. The logic high configuration bit C2 causes OR gate 941 to provide a logic high value, regardless of the state of the ACCESS_A signal. As a result, NAND gate 932 will provide a logic low output signal until one delay d3 after the ACCESS_A signal transitions to a logic low value. As discussed above, this occurs when the ACCESS_A_DONE signal transitions to a logic high voltage, after a delay of delay d1 plus delay d2. The configuration bit C2 is set to a logic high value for the read then write mode. (FIG. 8)

The WLEN_A signal is asserted high almost immediately after the ACCESS_A signal is asserted high, as a result of the logic low value provided at the output terminal of NAND gate 932. If the configuration bit C2 has a logic low value, then the WLEN_A signal transitions back to a low value after a predetermined delay equal to the delay d1. (FIGS. 6 and 7.) Conversely, if the configuration bit C2 has a logic high value, then the WLEN_A signal will transition back to a low value after a predetermined delay equal to the delay d1 plus the delay d2. (FIG. 8.) Note that the delay d3 is not involved in the generation of the WLEN_A signal.

The SENSE_A signal is a pulse generated by delay circuit 951, NAND gate 931 and inverter 923 in response to the ACCESS_A signal. The SENSE_A signal is asserted high one delay d1 after the ACCESS_A signal is asserted high, and is de-asserted low one delay d2 later, when the ACCESS_A signal is de-asserted low. The SENSE_A signal is generated independent of the configuration bits C1–C2, and is the same for all three of the write modes.

The WA_BL signal can only be asserted high if the WEN_A signal is high (i.e., during a write access). During a write access, the WEN_A signal is driven high while the ACCESS_A signal has a logic low value. In response to the logic low ACCESS_A signal, inverter 921 provides a logic high signal to the R and G input terminals of D latch 903. The logic high signal applied to the R input terminal resets D latch 903, such that D latch 903 provides a logic low Q output signal. When the ACCESS_A signal transitions to a logic high value, inverter 921 provides a logic low signal to the R and G input terminals of D latch 903. In response, the logic high WEN_A signal is latched into D latch 903, such that D latch 903 provides a logic high Q output signal. The logic high WEN_A signal is stored in D latch 903 until D latch 903 is reset when the ACCESS_A signal transitions to a logic low value.

The logic high WEN_A signal stored in D latch 903 is provided to an input terminal of AND gate 944. The other input terminal of AND gate 944 is coupled to receive configuration bit C2#, which is the complement of configuration bit C2. If configuration bit C2# has a logic high value (i.e., configuration bit C2 has a logic low value), then AND gate 944 will provide a logic high output value. In response, inverter 922 will provide a logic high signal to one of the input terminals of NAND gate 934. Inverter 922 will provide this logic high signal until D latch 903 is reset by the falling edge of the ACCESS_A signal. The other input terminal of NAND gate 934 is coupled to receive the WLEN_A signal. Under these conditions, inverter 927 will provide a WA_BL signal that follows the WLEN_A signal. Note that this occurs during the write with write back mode and the write without write back mode. (FIGS. 6 and 7.)

If the configuration bit C2# has a logic low value (i.e., configuration bit C2 has a logic high value), then AND gate 943, rather than AND gate 944 will control the output signal provided by inverter 922. Thus, the logic high WEN_A signal latched in D latch 903 is provided to one input terminal of AND gate 943, and the SENSE_A signal is provided to the other input terminal of AND gate 943. Under these conditions, inverter 922 provides an output signal that follows the SENSE_A signal. NAND gate 934 and inverter 927 provide a WA_BL signal that is the logical AND of the SENSE_A signal and the WLEN_A signal. Note that this configuration exists during the read then write mode. (FIG. 8.) Thus, during the read then write mode, the WA_BL signal is asserted in response to the rising edge of the SENSE_A signal, and is de-asserted in response to the falling edge of either the WLEN_A signal or the SENSE_A signal.

Finally, NAND gate 936 and inverter 929 provide the GATE_DOUT_A signal by generating the logical AND of the ACCESS_A_DONE signal, the SENSE_A signal and the output signal of NAND gate 937. NAND gate 937 receives as inputs the configuration bit C1 stored in configuration memory cell 911, the configuration bit C2#, and the output signal provided by inverter 922.

During a read access, D latch 903 is reset to provide a logic low value. As a result, inverter 922 provides a logic low value to NAND gate 937. In response, NAND gate 937 will always provide a logic high output signal during a read access. This logic high signal provided by NAND gate 937 effectively causes the GATE_DOUT_A signal to be the logical AND of the SENSE_A and ACCESS_A_DONE signals. Because the ACCESS_A_DONE signal is asserted high one delay d2 after the rising edge of the SENSE_A signal, the GATE_DOUT_A signal is asserted high shortly after the ACCESS_A_DONE signal is asserted high. The SENSE_A signal is then de-asserted low in response to the rising edge of the ACCESS_A_DONE signal. Thus, the GATE_DOUT_A signal is de-asserted low shortly after the SENSE_A signal is de-asserted low. (FIG. 5.)

For a write with write back operation, configuration memory cell 911 is programmed to store a logic low configuration bit C1. In response, NAND gate 937 provides a logic high value to NAND gate 936, regardless of the states of configuration bit C2 and the output of inverter 922. The logic high signal provided by NAND gate 937 effectively causes the GATE_DOUT_A signal to be the logical AND of the SENSE_A and ACCESS_A_DONE signals. Thus, the GATE_DOUT_A signal is generated in the same manner described above for a read access. (FIG. 6.)

For a read then write operation, configuration memory cell 912 is programmed to store a logic high configuration bit C2 (i.e., a logic low configuration bit C2#). In response, NAND gate 937 provides a logic high value to NAND gate 936, regardless of the states of configuration bit C1 and the output of inverter 922. The logic high signal provided by NAND gate 937 effectively causes the GATE_DOUT_A signal to be the logical AND of the SENSE_A and ACCESS_A_DONE signals. Thus, the GATE_DOUT_A signal is generated in the same manner described above for a read access. (FIG. 8.)

For a write without write back operation, configuration memory cell 911 is programmed to store a logic high configuration bit C1 and configuration memory cell 912 is programmed to store a logic low configuration bit C2 (i.e., configuration bit C2# is high). As a result, all of the input signals to NAND gate 937 have logic high states. (Note that the logic high configuration bit C2# and the logic high signal provided by D latch 903 cause inverter 922 to provide a logic high value.) In response, NAND gate 937 provides a logic low value to NAND gate 936, thereby forcing the GATE_DOUT_A signal to a logic low value. (FIG. 7.)

Although the invention has been described in connection with several embodiments, it is understood that this invention is not limited to the embodiments disclosed, but is capable of various modifications which would be apparent to a person skilled in the art. For example, while the write modes are selected in response to configuration bits stored in configuration memory cells in the described embodiment, it is understood that in other embodiments, the write modes can be selected by one or more user signals provided by the user after configuration of the FPGA. In these embodiments, it is possible for the user to select the write modes dynamically during operation of the FPGA. In addition, although the present invention has been described using three programmable write modes, it is understood that other numbers of write modes can be used in other embodiments. Thus, the invention is limited only by the following claims.

What is claimed is:

1. A programmable logic device comprising:
   a plurality of input/output blocks (IOBs);
   a plurality of configurable logic blocks (CLBs);
   a dedicated block random access memory (RAM) located adjacent to the CLBs, the block RAM including:
      a memory cell array; and
      control logic that is configurable to select one of a plurality of write modes for accessing the memory cell array; and
   programmable interconnect circuitry for programmably connecting the IOBs, CLBs, and block RAM.

2. The programmable logic device of claim 1, wherein the write modes comprise a write with write-back mode, a write without write-back mode, and a read then write mode.

3. The programmable logic device of claim 1, wherein the memory cell array comprises an array of multi-port memory cells, each having a first port and a second port.

4. The programmable logic device of claim 3, wherein the block RAM further comprises:

a first port for accessing the multi-port memory cells; and
   a second port for accessing the multi-port memory cells, wherein the first port is independent of the second port.

5. The programmable logic device of claim 4, wherein the control logic includes a first portion for selecting a first write mode for the first port, and a second portion for selecting a second write mode for the second port.

6. The programmable logic device of claim 5, wherein the first write mode is different than the second write mode.

7. The programmable logic device of claim 5, wherein the first write mode is the same as the second write mode.

8. The programmable logic device of claim 4, wherein the width of the first port is different than the width of the second port.

9. The programmable logic device of claim 1, wherein the control logic includes a configuration memory cell that is programmed to select one of the write modes.

10. A method of operating a programmable logic device including a dedicated block random access memory (RAM), the method comprising the steps of:
    configuring the programmable logic device;
    programming one or more configuration memory cells to store one or more corresponding configuration bits;
    selecting a write mode from a plurality of predetermined write modes in response to the one or more configuration bits; and
    operating the block RAM in response to the selected write mode.

11. The method of claim 10, wherein the step of programming is performed during configuration of the programmable logic device.

12. The method of claim 10, wherein the plurality of predetermined write modes include a write with write-back mode, a write without write-back mode, and a read then write mode.

13. The method of claim 10, wherein the block RAM is a multi-port memory having a first port and a second port, the method further comprising the steps of:
    selecting a first write mode for the first port in response to the one or more configuration bits;
    operating the first port of the block RAM in accordance with the first write mode;
    selecting a second write mode for the second port in response to the one or more configuration bits; and
    operating the second port of the block RAM in accordance with the second write mode.

14. The method of claim 13, wherein the first write mode is different than the second write mode.

15. The method of claim 13, wherein the first write mode is the same as the second write mode.

16. A method of operating a programmable logic device including a dedicated block random acress memory (RAM), the method comprising the steps of:
    configuring the programmable logic device;
    providing one or more user signals to the block RAM;
    selecting a write mode from a plurality of predetermined write modes in response to the one or more user signals; and
    operating the block RAM in response to the selected write mode;
    wherein the plurality of predetermined write modes include a write with write-back mode wherein a value being written to the memory cell array also appears at an output port of the memory cell array, a write without write-back mode wherein a value being written to the memory cell array does not appear at an output port of the memory cell array, and a read then write mode.

17. A method of operating a programmable logic device including a dedicated block random access memory (RAM), the method comprising the steps of:

configuring the programmable logic device;

providing one or more user signals to the block RAM;

selecting a write mode from a plurality of predetermined write nodes in response to the one or more user signals; and operating the block RAM in response to the selected write mode;

wherein the block RAM is a multi-port memory having a first port and a second port, the method further comprising the steps of:

selecting a first write mode for the first port in response to the one or more user signals;

operating the first port of the block RAM in accordance with the first write mode;

selecting a second write mode for the second port in response to the one or more user signals; and operating the second port of the block RAM in accordance with the second write mode.

18. The method of claim 17, wherein the first write mode is different than the second write mode.

19. The method of claim 17, wherein the first write mode is the same as the second write mode.

20. A dedicated block random access memory (RAM) located on a programmable logic device, the block RAM comprising:

a memory cell array; and control logic that is configurable to select one of a plurality of write modes for accessing the memory cell array, wherein the write modes include (a) a write with write-back mode wherein a value being written to the memory cell array also appears at an output port of the memory cell array, (b) a write without write-back mode wherein a value being written to the memory cell array does not appear at an output port of the memory cell array, and (c) a read then write mode.

21. The dedicated block RAM of claim 20, wherein the memory cell array comprises an array of multi-port memory cells, each having a first port and a second port.

22. The dedicated block RAM of claim 21, wherein the block RAM further comprises:

a first port for accessing the multi-port memory cells; and a second port for accessing the multi-port memory cells, wherein the first port is independent of the second port.

23. The dedicated block RAM of claim 22, wherein the control logic includes a first portion for selecting a first write mode for the first port, and a second portion for selecting a second write mode for the second port.

24. The dedicated block RAM of claim 23, wherein the first write mode is different than the second write mode.

25. The dedicated block RAM of claim 23, wherein the first write mode is the same as the second write mode.

26. The dedicated block RAM of claim 22, wherein the width of the first port is different than the width of the second port.

27. The dedicated block RAM of claim 20, wherein the control logic includes a configuration memory cell that is programmed to select one of the write modes.

* * * * *